(12) United States Patent
O'Neal et al.

(10) Patent No.: US 6,222,264 B1
(45) Date of Patent: Apr. 24, 2001

(54) COOLING APPARATUS FOR AN ELECTRONIC PACKAGE

(75) Inventors: Sean P. O'Neal, Round Rock; Reynold L. Liao; Phillip C. Gilchrist, both of Austin, all of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/419,441

(22) Filed: Oct. 15, 1999

(51) Int. Cl.$^7$ ...................................................... H01L 23/02
(52) U.S. Cl. ............................................. 257/714; 257/706
(58) Field of Search ................................... 257/706, 707, 257/714, 712; 438/122

(56) References Cited

U.S. PATENT DOCUMENTS

| | | |
|---|---|---|
| 3,741,292 | 6/1973 | Aakalu . |
| 3,999,105 | 12/1976 | Archey . |
| 4,233,645 | 11/1980 | Balderes . |
| 4,414,562 | 11/1983 | Kiley . |
| 4,558,395 | 12/1985 | Yamada . |
| 4,567,505 | 1/1986 | Pease . |
| 4,573,067 | 2/1986 | Tuckerman . |
| 4,686,606 | 8/1987 | Yamada . |
| 4,758,926 | 7/1988 | Herrell . |
| 5,021,924 | 6/1991 | Kieda . |
| 5,022,462 | 6/1991 | Flint . |
| 5,050,036 | 9/1991 | Oudick . |
| 5,184,211 | 2/1993 | Fox . |
| 5,272,599 | 12/1993 | Koenen . |
| 5,329,419 | 7/1994 | Umezawa . |
| 5,345,107 | 9/1994 | Daikoku . |
| 5,380,956 | 1/1995 | Loo . |
| 5,471,844 | 12/1995 | Levi . |
| 5,514,906 | 5/1996 | Love . |
| 5,536,972 | * 7/1996 | Kato . |
| 5,834,839 | * 11/1998 | Mertol . |
| 5,841,634 | * 11/1998 | Visser . |
| 5,870,823 | * 2/1999 | Bezama et al. . |
| 6,037,658 | * 3/2000 | Brodsky et al. . |

* cited by examiner

Primary Examiner—Sheila V. Clark
(74) Attorney, Agent, or Firm—Haynes and Boone, L.L.P.

(57) ABSTRACT

An electronic apparatus including a semiconductor device mounted on a substrate. A support member is disposed between the semiconductor device and the substrate. A heat dissipating body has a cavity formed therein. The heat dissipating body is positioned adjacent to the support member with the heat generating device received within the cavity. The cavity is sized to define a gap between the heat dissipating body and the semiconductor device. A flowable thermally conductive material is disposed within a portion of the gap. A sealing member is disposed between the heat dissipating body and the support member. A principal advantage is that the flowable material can be used in mass produced devices such as electronic packages for computers. Preferred interface materials are phase change materials and thermally conductive greases.

23 Claims, 2 Drawing Sheets

COOLING APPARATUS FOR AN ELECTRONIC PACKAGE

BACKGROUND

The disclosures herein relate generally to electronic packages and more particularly to a cooling apparatus for electronic packages.

Many electronic packages include electronic devices such as central processing units (commonly referred to as the microprocessor) that generate a considerable amount of heat. The performance and operating life of these devices are adversely affected by excessive temperatures. As a result, it is necessary to use a cooling apparatus to control the operating temperature of these types of heat generating devices.

U.S. Pat. No. 5,345,107 discloses a cooling apparatus for an electronic device. A cooling solid body is in close contact through a thermally conductive fluid with a heat transfer portion of the electronic device. A number of grooves communicate with the outside of the heat transfer portion of the electronic device. A spring member forces the cooling solid body into close contact with the electronic device to enhance heat transfer.

U.S. Pat. No. 5,184,211 discloses a packaging and cooling assembly for integrated circuit chips. The assembly includes a base for receiving one or more circuit chips and a combination heat sink and cover for attachment to the base. Compliant cushions that generally conform to the shape and size of the chips are held loosely between the circuit sides of the chips and the base. The heat sink engages the back sides of the circuit chips when it is attached to the base. This causes the chips to compress the compliant cushions, thereby holding the chips firmly in position, and forming a high thermal conductivity interface between the chips and the heat sink. To further enhance the heat transfer characteristics of the interface, a thin film of fluid is coated on the back sides of each chip to fill in the microvoids which result from uneven contact of the heat sink and chip mating surfaces. A sealing gasket is provided between the heat sink and the base to form a protective enclosure for the chips.

U.S. Pat. No. 4,414,562 discloses a semiconductor assembly, comprising a flat disc-shaped semiconductor with terminals on opposite faces, with an electrically conductive heat sink in electrical and thermal contact with each face. The semiconductor device and heat sinks are enclosed and maintained under compression by a rigid frame. The heat sinks are electrically insulated from each other and from the rigid frame by an insulating bond which secures these components together. Variations in compressive pressure, holding the heat sinks in facing contact with the semiconductor device, is compensated by a thermally responsive element positioned between each heat sink and the rigid frame in linear alignment with each other and the semiconductor device. Increases in temperature will expand the thermally responsive element to increase compression forces on the assembly of heat sinks and semiconductor devices U.S. Pat. No. 4,233,645 discloses a semiconductor device package having a substrate, one or more semiconductor devices mounted on a top surface of the substrate, and a heat sink having a surface in opposed spaced parallel relation to the top surface of the substrate. At least one deformable heat transfer member is positioned between a device mounted on the top surface of the substrate and the surface of the heat sink. The heat transfer member includes a porous block of material having a heat conductive non-volatile liquid retained within the block of material by a surface tension. The heat transfer member is operative to transfer heat from the device to the heat sink.

In a portable computer, the use of a cooling apparatus to control the operating temperature of the microprocessor is essential. Furthermore, maintaining a suitable thermal interface between the microprocessor and the attached cooling apparatus is extremely critical. If the microprocessor temperature is not kept within the specification limits of the component, the effective life and performance of the microprocessor will be greatly diminished. This is especially true as the power consumption of semiconductor devices such as microprocessors continues to increase. Minimizing the thermal resistance between the microprocessor and the attached cooling apparatus can greatly improve cooling efficiency. This will often translate to less weight and/or higher performance of the cooling apparatus.

Direct contact of a cooling apparatus such as a heat sink or a thermal block to the microprocessor is undesirable in many applications. Recently, some manufacturers have begun designing their microprocessors without an integral heat plate. As a result, the microprocessor can be easily damaged by stresses caused by direct contact with an object such as a heatsink or thermal block.

To establish effective thermal transfer between two mechanically fastened parts, a suitable thermal interface material is needed to ensure maximum surface-to-surface contact. Mainly, three types of industry standard thermal interface materials are used: thermal pads, phase change materials and thermal grease. Thermal greases and phase change materials can have less than one-tenth the thermal resistance of thermal pads. The superior thermal resistance is partially because the thermal grease and the phase change material are "flowable" materials. They flow to conform to surface imperfections in the semiconductor and in the contact surface of the cooling device. Their effectiveness is also not significantly impacted by misalignment between the heat generating device and the cooling apparatus.

Although flowable materials work well at initial application, the effectiveness of the thermal interface will degrade over time due to a natural phenomenon often referred to as the "pumping effect". The pumping effect happens when the thermal interface material experiences heating and cooling cycles. The interface material expands when it is heated. The expanded material flows out of the interface area. Upon returning to room temperature, the material contracts and flows back to its original volume.

However, after repeated thermal cycling, not all of the material flows back into the interface area. Due to the continuous loss of thermal interface material over time, the interface will eventually be devoid of enough of the flowable material to effectively conduct heat away from the heat generating device. The resulting interface exhibits a much higher thermal resistance than would have been achieved with direct surface-to-surface contact.

Due to the pumping effect, the better performing thermal interface materials such as thermal grease or phase change materials are typically not used in mass produced electronic equipment such as computers. The maximum efficiency of the cooling apparatus is limited and the long term performance is unpredictable. As a result, for long term use in mass produced computer systems, only thermal pads are used to effectively interface the microprocessor and the attached cooling apparatus.

Accordingly, there is a need for a cooling apparatus that allows flowable thermal interface materials to be used in the mass production of electronic devices such as computers.

SUMMARY

One embodiment, accordingly, provides a cooling device for controlling the operating temperature of a semiconductor. To this end, one embodiment provides an electronic apparatus including a substrate, a heat generating device mounted on the substrate and a heat dissipating body having a cavity formed in a mounting surface of the heat dissipating body. The mounting surface of the heat dissipating body is positioned adjacent to the substrate with the heat generating device positioned within the cavity. The cavity is sized to define a gap between the heat dissipating body and the heat generating device. A flowable thermally conductive material is disposed within at least a portion of the gap. A sealing member is disposed between the heat dissipating body and the substrate.

A principal advantage of this embodiment is that flowable thermal interface materials such as thermal greases and phase change materials can be used in mass production.

BRIEF DESCRIPTION OF THE DRAWING FIGURES

DETAILED DESCRIPTION

Figure 1:
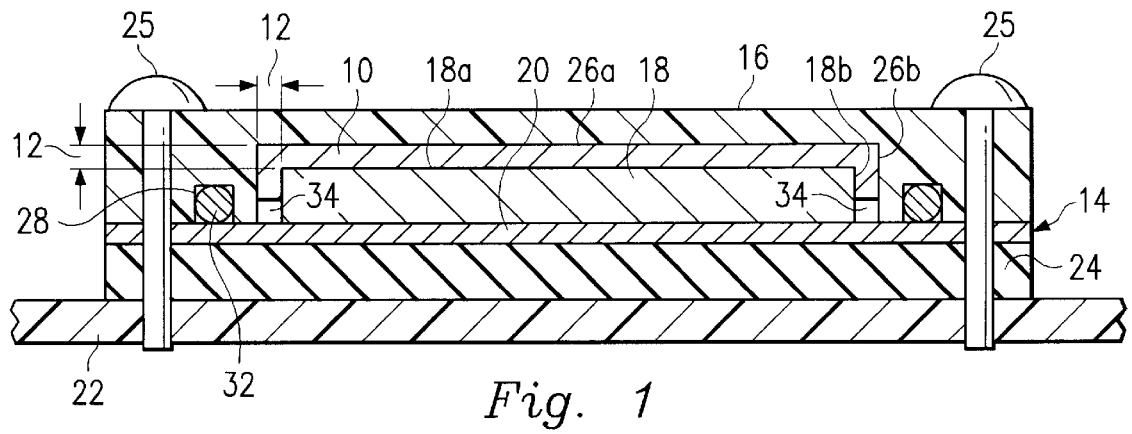
FIG. 1 is a cross sectional view illustrating an embodiment of an apparatus for containing a flowable material in a gap between a semiconductor device and a heat dissipating body.

An embodiment of an apparatus for retaining a flowable thermally conductive material 10 in a gap 12 between an electronic package 14 and a heat dissipating body 16 is illustrated in FIG. 1. The electronic package 14 includes a semiconductor device 18 such as a microprocessor. The semiconductor device 18 is one of many heat generating devices in an electronic system such as a computer. The semiconductor 18 is mounted on a substrate 20 such as a printed circuit board or a flexible circuit. The electronic package 14 is electrically attached to another substrate 22 such as a motherboard through a connector 24. A plurality of fasteners 25 secure the heat dissipating body 16 and the electronic package 14 to the substrate 22. The fasteners 25 may be threaded fasteners, rivets or other types of fastening devices.

Figure 2:
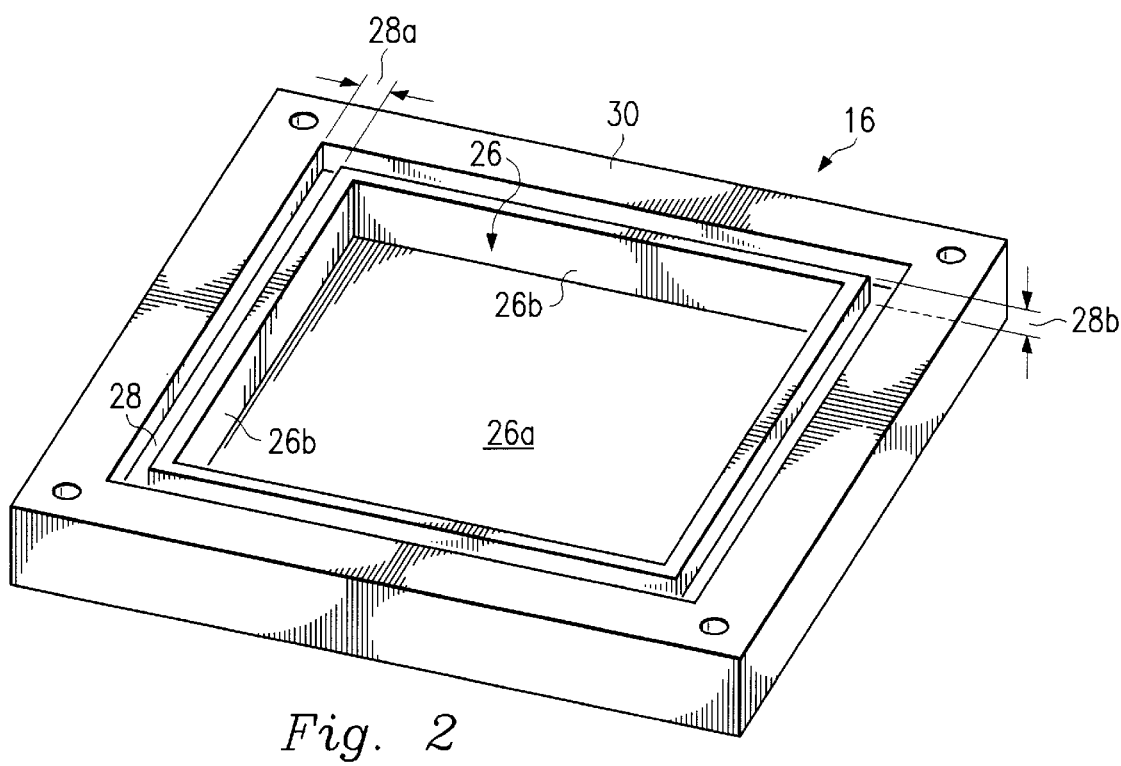
FIG. 2 is a perspective view illustrating an embodiment of a heat dissipating body.

As illustrated in FIG. 2, the heat dissipating body 16 includes a cavity 26 and a channel 28 formed in a mounting surface 30. The cavity 26 has a closed end 26a and a plurality of side walls 26b. The channel 28 has a width 28a and a depth 28b. A sealing member 32 is mounted between the substrate 20 of the electronic package 14 and the channel 28 of the heat dissipating body 16, FIG. 1.

Figure 3:
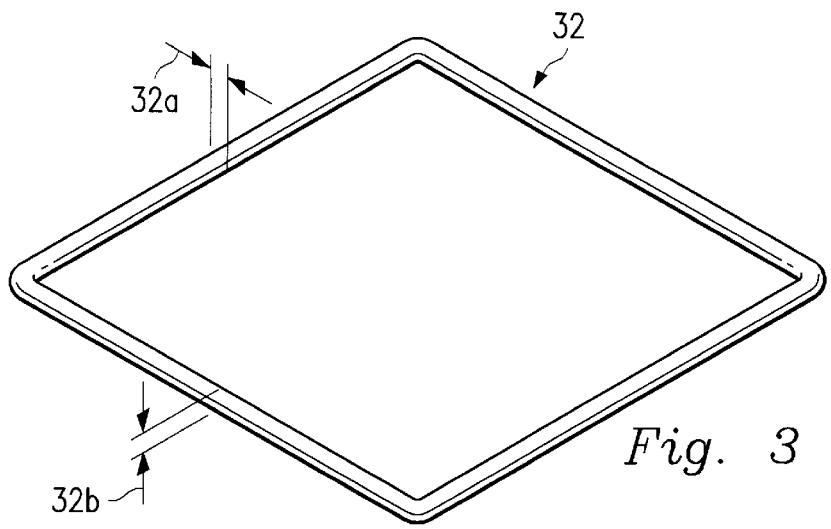
FIG. 3 is a perspective view illustrating an embodiment of a sealing member.

An embodiment of the sealing member 32 is illustrated in FIG. 3. The sealing member 32 has a thickness 32a and a depth 32b. For typical applications, the sealing member 32 is made of a resilient, heat resistant material such as silicone. For proper sealing, the thickness 32a will be approximately equal to or less than the width 28a of the channel 28. Depending on the application, the depth 32b may be greater than, equal to or less than the depth 28b of the channel 28.

The heat dissipating body 16 may be a finned type heat sink or a heat plate for use with one or more heat pipes and a heat exchanger. The cavity 26 is sized with respect to the semiconductor device 18 to define the gap 12, FIG. 1. The gap 12 is formed between the closed end 26a of the cavity 26 and a top surface 18a of the semiconductor device 18. The gap 12 is also formed between each one of the side walls 26b of the cavity 26 and a corresponding side surface 18b of the semiconductor device 18.

Figure 4:
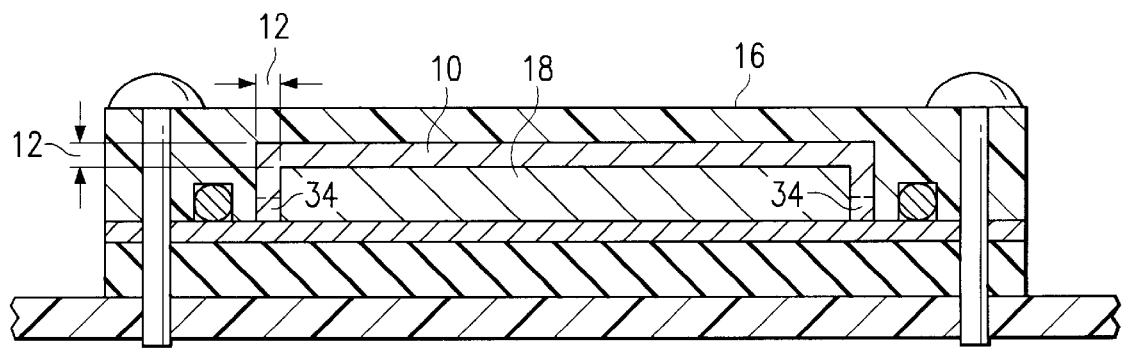
FIG. 4 is a cross sectional view illustrating an embodiment of the apparatus with the flowable material in a thermally expanded state.
Figure 5:
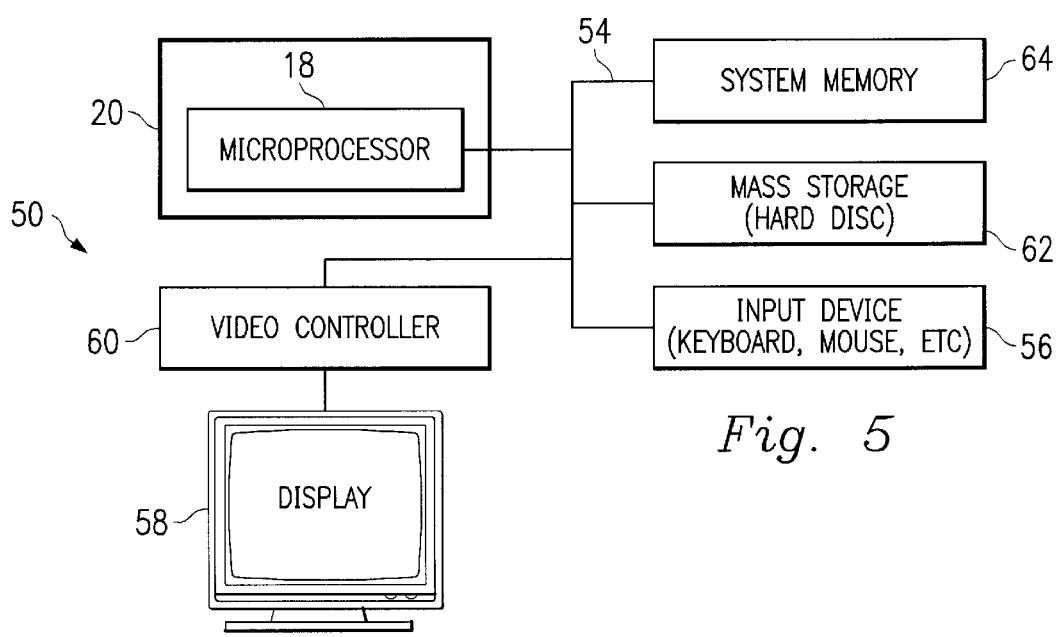
FIG. 5 is a block diagram illustrating an embodiment of a computer system.

A specified volume of the thermally conductive material 10 is dispensed into the cavity 26 prior to the semiconductor device 18 being positioned in the cavity 26. To compensate for thermal expansion of the thermally conductive material 10 when at the operating temperature of the semiconductor device 18, the specified volume of the thermally conductive material 10 at ambient temperature is less than a volume defined by the gap 12 between the semiconductor device 18 and the heat dissipating body 16. When the semiconductor device 18 is positioned in the cavity 26, the thermally conductive material 10 is displaced to fill only a portion of the gap 12 such that an unfilled portion 34 of the gap is defined. During operation of the semiconductor device 18, the temperature of the thermally conductive material 10 is increased to approximately that of the operating temperature of the semiconductor device 18. As illustrated in FIG. 4, upon heating, the thermally conductive material 18 expands to fill all or part of the unfilled portion 34 of the gap 12.

The thermally conductive material may be a thermal grease or a phase change material. Suitable thermal greases include the product sold under the trademark T-Grease by Thermagon Incorporated, either under the part number 401, or under the name Sil-less. Suitable phase change materials include the product sold by ORCUS Incorporated under the name Thermaphase. The thermal greases and phase change materials can be applied using a variety of commercially available manual and automatic dispensing and coating equipment.

An embodiment of a computer system 50 is illustrated in FIG. 4. The computer system 50 includes at least one microprocessor 18 mounted on a substrate 20. The microprocessor 18 is connected to a bus 54. The bus 54 serves as a connection between the microprocessor 18 and other components of the computer system 50. One or more input devices 56 may be coupled to the microprocessor 18 to provide input to the microprocessor 18. Examples of input devices include keyboards, touchscreens, and pointing devices such as a mouse, a trackball and a trackpad. The computer system 50 may also include a display 58 which is coupled to the microprocessor 18 typically by a video controller 60. Programs and data are stored on a mass storage device 62 which is coupled to the microprocessor 18. Mass storage devices include components such as hard disks, optical disks, magneto-optical drives, floppy drives, and the like. A system memory 64 provides the microprocessor 18 with fast storage to facilitate execution of computer programs by the microprocessor 18. It should be understood that other busses and intermediate circuits can be employed between the components described above and microprocessor 18 to facilitate interconnection between the components and the microprocessor 18.

One embodiment provides an electronic apparatus including a substrate, a heat generating device mounted on the substrate and a heat dissipating body having a cavity formed in a mounting surface of the heat dissipating body. The mounting surface of the heat dissipating body is positioned adjacent to the substrate with the heat generating device positioned within the cavity. The cavity is sized to define a gap between the heat dissipating body and the heat generating device. A flowable thermally conductive material is disposed within at least a portion of the gap. A sealing member is disposed between the heat dissipating body and the substrate.

Another embodiment provides a computer system including a microprocessor mounted on a substrate, an input coupled to provide input to the microprocessor, storage coupled to the microprocessor and system memory coupled to provide storage to facilitate execution of computer programs by the microprocessor. A heat dissipating body having a cavity formed in a mounting surface thereof is provided. The mounting surface of the heat dissipating body is positioned adjacent to the substrate with the heat generating device positioned within the cavity. The cavity is sized to define a gap between the heat dissipating body and the semiconductor device. A flowable thermally conductive material is disposed within at least a portion of the gap. A sealing member is disposed between the heat dissipating body and the substrate.

A further embodiment provides a method of cooling a heat generating device. The method includes mounting a semiconductor device on a substrate with a support member disposed between the semiconductor device and the substrate. A cavity is then formed in a heat dissipating body for receiving the semiconductor device. The cavity is sized to define a gap between the heat dissipating body and the semiconductor device. A prescribed quantity of flowable thermally conductive material is then dispensed within the cavity and the heat dissipating body is positioned adjacent to the support member with the semiconductor device positioned within the cavity such that the prescribed quantity of flowable material fills at least a portion of the gap. In conjunction with positioning the heat dissipating body adjacent to the semiconductor device, a seal is formed between the heat dissipating body and the substrate.

As it can be seen, the embodiments presented herein provide several advantages. The most effective thermal interface materials can be used in mass production. There is no direct contact with the heat generating device and the heat dissipating body that could cause cracks. The thermal interface material touches the sides and top of the heat generating device instead of only the top giving more surface area for conductive heat transfer. Screw torque does not need to be tightly controlled since the heat dissipating body can be configured to bottom out on the substrate.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An electronic apparatus, comprising:
a substrate;
a heat generating device mounted on the substrate;
a heat dissipating body having a cavity formed in a mounting surface thereof, the mounting surface of the heat dissipating body being positioned adjacent to the substrate with the heat generating device positioned within the cavity, the cavity sized to define a gap between the heat dissipating body and the heat generating device;
a flowable thermally conductive material disposed within at least a portion of the gap; and
a sealing member disposed between the heat dissipating body and the substrate.

2. The apparatus of claim 1 wherein the heat dissipating body includes a channel formed in the mounting surface around the cavity, the sealing member being positioned in the channel.

3. The apparatus of claim 2 wherein the sealing member has a thickness greater than a depth of the channel such that the mounting surface of the heat dissipating body is offset from the substrate.

4. The apparatus of claim 1 wherein the material is a thermally conductive grease.

5. The apparatus of claim 1 wherein the material is a phase change material.

6. The apparatus of claim 1 wherein the gap defines a first volume and wherein a second volume of the material is disposed in the gap, the second volume being less than the first volume when the material is at an ambient temperature and the second volume being approximately equal to the first volume when the material is at an operating temperature of the heat generating device.

7. The apparatus of claim 1 wherein the material is disposed between a top surface of the heat generating device and a corresponding surface of the cavity.

8. The apparatus of claim 1 wherein the mounting surface is offset from the substrate by an offset distance.

9. The apparatus of claim 1 wherein the heat generating device includes a top surface and a plurality of side surfaces and wherein the material substantially fills the gap adjacent to the top surface and at least partially fills the gap adjacent to each one of the side surfaces.

10. The apparatus of claim 9 wherein the cavity includes a closed end adjacent to the top surface of the heat generating device and a side wall adjacent to each one of the plurality of side surfaces of the heat generating device.

11. The apparatus of claim 1 wherein the heat generating device is a semiconductor device.

12. The apparatus of claim 11 wherein the semiconductor device is a microprocessor.

13. A computer system, comprising:
a microprocessor mounted on a substrate;
an input coupled to provide input to the microprocessor;
storage coupled to the microprocessor;
system memory coupled to provide storage to facilitate execution of computer programs by the microprocessor;
a heat dissipating body having a cavity formed in a mounting surface thereof, the mounting surface of the heat dissipating body being positioned adjacent to the substrate with the heat generating device positioned within the cavity, the cavity sized to define a gap between the heat dissipating body and the semiconductor device;
a flowable thermally conductive material disposed within at least a portion of the gap; and
a sealing member disposed between the heat dissipating body and the substrate.

14. The apparatus of claim 13 wherein the heat dissipating body includes a channel formed in the mounting surface around the cavity, the sealing member being positioned in the channel.

15. The apparatus of claim 14 wherein the sealing member has a thickness greater than a depth of the channel such that the mounting surface of the heat dissipating body is offset from the substrate.

16. The apparatus of claim 13 wherein the material is a thermally conductive grease.

17. The apparatus of claim 13 wherein the material is a phase change material.

18. The apparatus of claim 13 wherein the gap defines a first volume and wherein a second volume of the material is disposed in the gap, the second volume being less than the first volume when the material is at an ambient temperature and the second volume being approximately equal to the first volume when the material is at an operating temperature of the semiconductor device.

19. The apparatus of claim 13 wherein the material is disposed between a top surface of the semiconductor device and a corresponding surface of the cavity.

20. The apparatus of claim 13 wherein the mounting surface is offset from the substrate by an offset distance.

21. The apparatus of claim 13 wherein the semiconductor device includes a top surface and a plurality of side surfaces and wherein the material substantially fills the gap adjacent to the top surface and at least partially fills the gap adjacent to each one of the side surfaces.

22. The apparatus of claim 21 wherein the cavity includes a closed end adjacent to the top surface of the semiconductor device and a side wall adjacent to each one of the plurality of side surfaces of the semiconductor device.

23. A method of cooling a heat generating device, comprising the steps of:

mounting a semiconductor device on a substrate with a support member disposed between the semiconductor device and the substrate;

forming a cavity in a heat dissipating body for receiving the semiconductor device, the cavity being sized to define a gap between the heat dissipating body and the semiconductor device;

applying a prescribed quantity of flowable thermally conductive material within the cavity;

positioning the heat dissipating body adjacent to the support member with the semiconductor device received within the cavity, whereby the prescribed quantity of flowable material fills at least a portion of the gap; and in response to positioning the semiconductor device in the cavity, forming a seal between the heat dissipating body and the substrate.

* * * * *